United States Patent [19]

Shigehara et al.

[11] Patent Number: 5,539,327
[45] Date of Patent: Jul. 23, 1996

[54] PROTECTION CIRCUIT WHICH PREVENTS AVALANCHE BREAKDOWN IN A FET BY HAVING A FLOATING SUBSTRATE AND A VOLTAGE CONTROLLED GATE

[75] Inventors: Hiroshi Shigehara, Oita; Masanori Kinugasa, Yokohama, both of Japan

[73] Assignee: Kabushiki Kaisha Toshiba, Kawasaki, Japan

[21] Appl. No.: 353,383

[22] Filed: Dec. 2, 1994

[30] Foreign Application Priority Data

Dec. 2, 1993 [JP] Japan ................................. 5-302820

[51] Int. Cl.⁶ ........................................................ H02H 9/04
[52] U.S. Cl. ................................ 326/30; 361/56; 361/91; 257/361
[58] Field of Search ................................ 361/56, 91, 118, 361/111, 212; 257/355, 356, 357, 358, 359, 360, 361, 362, 363; 326/9, 30, 23

[56] References Cited

U.S. PATENT DOCUMENTS

| | | | |
|---|---|---|---|
| 4,789,917 | 12/1988 | Miller | 361/56 |
| 4,829,350 | 5/1989 | Miller | 361/91 |
| 4,924,339 | 5/1990 | Atsumi et al. | 361/56 |
| 5,086,365 | 2/1992 | Lien | 361/56 |
| 5,389,811 | 2/1995 | Poucher et al. | 257/357 |

FOREIGN PATENT DOCUMENTS

| | | |
|---|---|---|
| 0168552A2 | 1/1986 | European Pat. Off. . |
| 0173108A3 | 3/1986 | European Pat. Off. . |
| 5-37336 | 2/1993 | Japan . |
| 5-167427 | 7/1993 | Japan . |

OTHER PUBLICATIONS

Publication, "Physics and Technology of Semiconductor Devices", A. S. Grove (John Wiley and Sons, Inc., 1976, pp. 231–233.

Primary Examiner—Edward P. Westin
Assistant Examiner—Benjamin D. Driscoll
Attorney, Agent, or Firm—Banner & Allegretti

[57] ABSTRACT

A transistor circuit comprises a MOS transistor with an open back gate, and control means for controlling a voltage to be applied to the control gate of the MOS transistor, whereby the control means controls the avalanche breakdown voltage of a parasitic bipolar transistor formed by the drain, back gate and source of the MOS transistor.

8 Claims, 4 Drawing Sheets

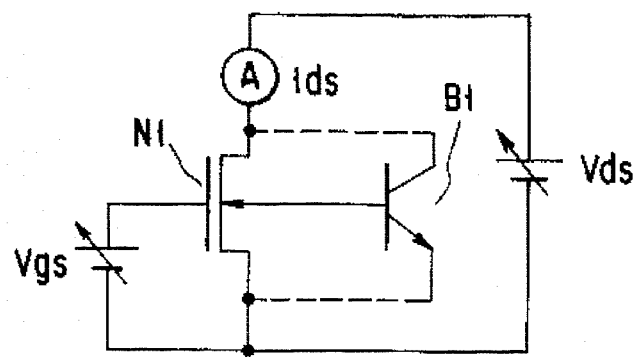
F I G. 1
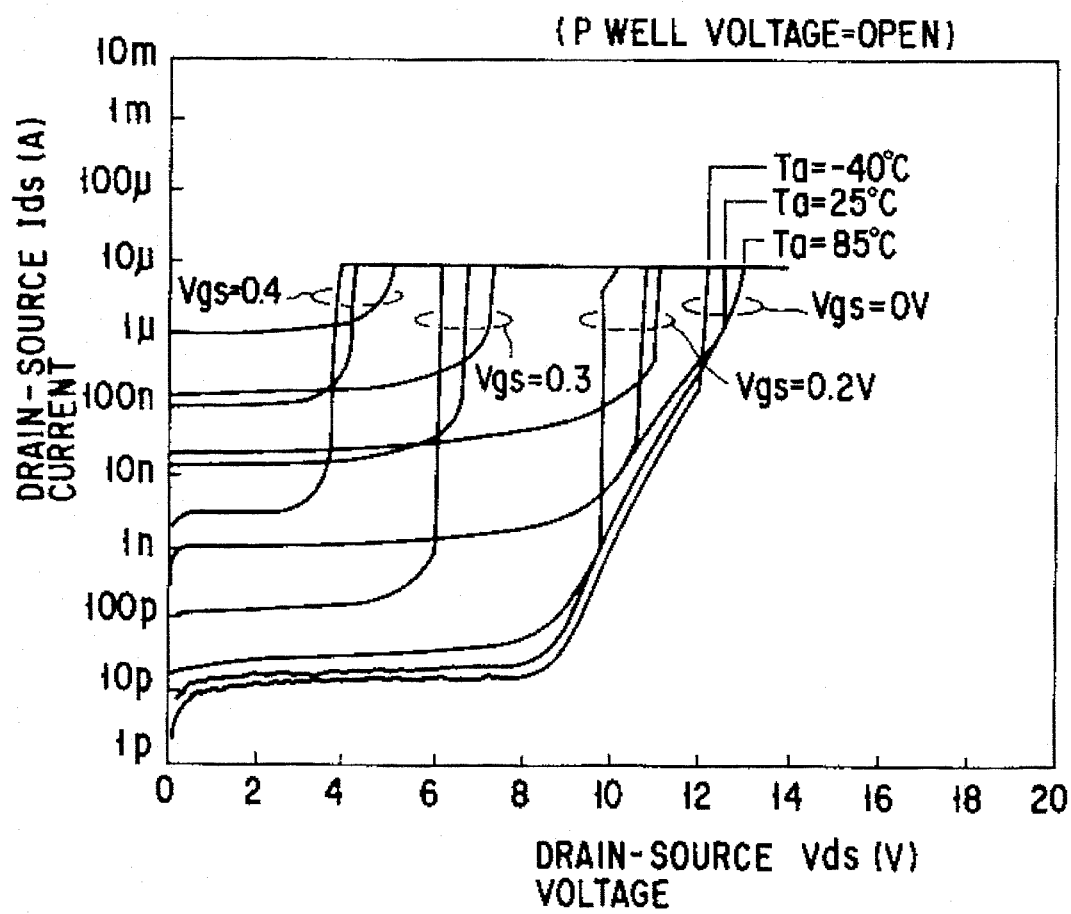
F I G. 2

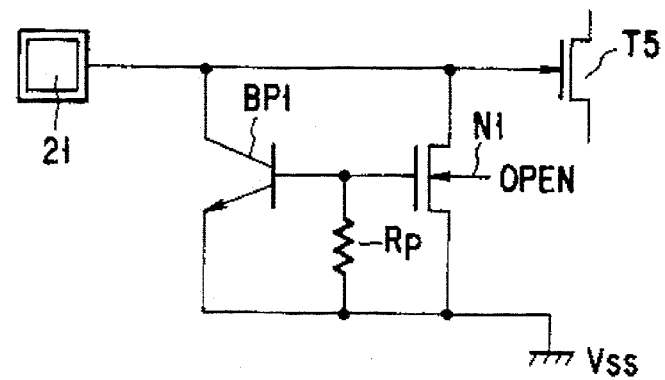
F I G. 5
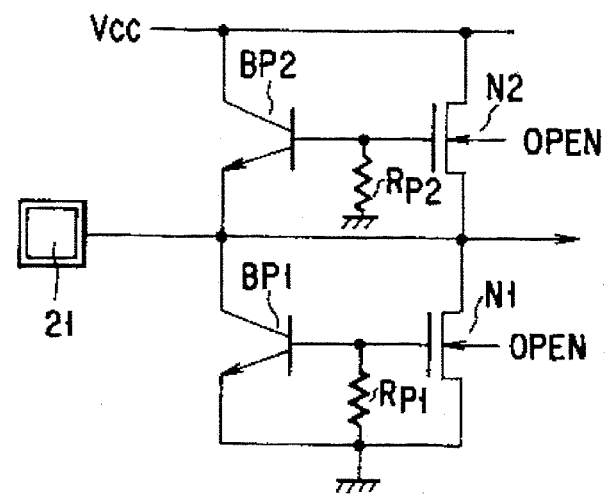
F I G. 6
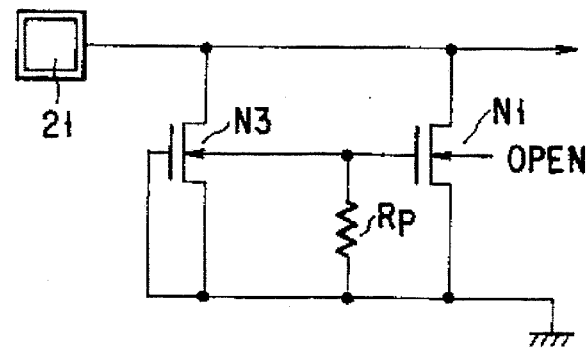
F I G. 7
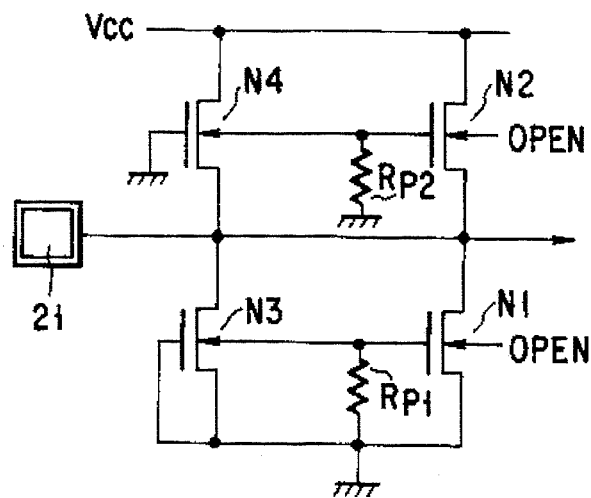
F I G. 8

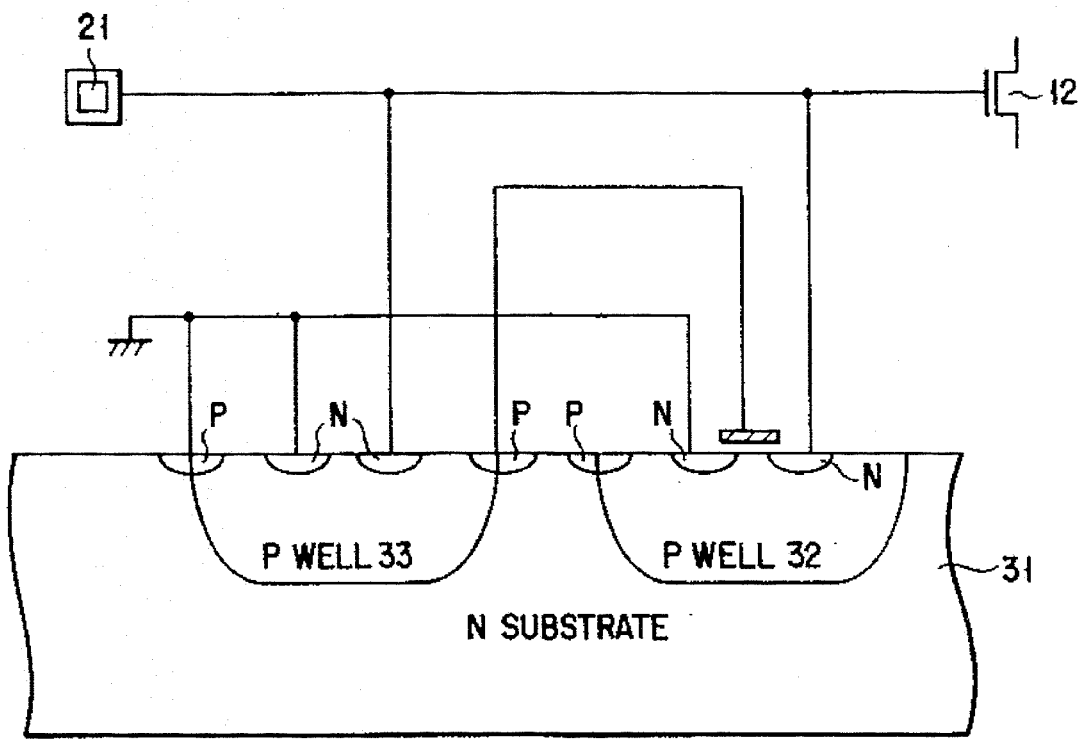
F I G. 9

PROTECTION CIRCUIT WHICH PREVENTS AVALANCHE BREAKDOWN IN A FET BY HAVING A FLOATING SUBSTRATE AND A VOLTAGE CONTROLLED GATE

BACKGROUND OF THE INVENTION

1. Field of the Invention

The present invention relates to a circuit including a MOS transistor, and, more particularly, to control of the drain-source breakdown voltage of a MOS transistor.

2. Description of the Related Art

It is generally known that as the collector-emitter voltage is kept applied to a bipolar transistor having an open base, avalanche breakdown occurs at a certain voltage, causing a large current to flow between the collector and emitter. This is because the dark current between the collector and emitter causes an electron avalanche in the base area. This is described, for example, on pages 231–233 in "Physics and Technology of Semiconductor Devices" (John Wiley and Sons, Inc. 1976) by A. S. Grove.

Although the aforementioned mechanism for causing the avalanche breakdown is conventionally known, the avalanche breakdown voltage depends on the manufacturing process of semiconductor devices, such as the impurity concentration of the base, and cannot be changed once the device manufacturing process is determined.

SUMMARY OF THE INVENTION

Accordingly, it is an object of the present invention to provide a transistor circuit which can electrically control the avalanche breakdown voltage even after the manufacturing process of semiconductor devices is determined.

A transistor circuit according to this invention comprises a MOS transistor with an open back gate, and control means for controlling a voltage to be applied to the control gate of the MOS transistor, whereby the control means controls the avalanche breakdown voltage of a parasitic bipolar transistor formed by the drain, back gate and source of the MOS transistor.

The present inventors discovered that the avalanche breakdown voltage of a parasitic bipolar transistor formed by the source, back gate (substrate) and drain of a MOS transistor is controllable by changing the gate voltage of this MOS transistor, and the present invention has been devised in view of this discovery. If the avalanche breakdown voltage is controllable, it is possible to prevent the avalanche breakdown of the parasitic bipolar transistor of the MOS transistor from occurring to, permit the avalanche breakdown to occur at an early stage, or to delay the occurrence of the avalanche breakdown as much as possible. This invention can therefore provide a transistor circuit which can be used in a variety of applications and is very advantageous.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a diagram showing a circuit for testing a transistor used in the present invention;

FIG. 2 is a chart showing characteristic curves obtained by the testing circuit;

FIG. 5 is a circuit diagram of another embodiment of this invention;

FIG. 6 is a circuit diagram of a different embodiment of this invention;

FIG. 7 is a circuit diagram of a further embodiment of this invention;

FIG. 8 is a circuit diagram of a still further embodiment of this invention; and FIG. 9 is a cross-section view of a main portion of the circuit diagram shown in FIG. 5.

DETAILED DESCRIPTION OF THE PREFERRED EMBODIMENTS

Embodiments of the present invention will now be described referring to the accompanying drawings.

The present inventors studied the avalanche breakdown voltage of a parasitic bipolar transistor constituted by the drain, back gate and source of a MOS transistor in a MOS-transistor based semiconductor circuit and discovered that if a voltage is applied between the drain and source of the transistor with its back gate (substrate) open and having a gate voltage applied thereto, the avalanche breakdown voltage of the parasitic bipolar transistor decreases. This discovery was made by of obtaining the characteristics of the drain-source voltage Vds versus the drain-source current Ids when Vgs=0 v, 0.2 v, 0.3 v or 0.4 v is applied to the gate of an NMOS transistor N1 using the measuring circuit shown in FIG. 1 while setting the back gate (P well substrate in this case) in an open state, as shown in FIG. 1. The obtained Vds versus Ids characteristics are shown in FIG. 2. The characteristic curves in FIG. 2 include the temperature dependency (Ta=−40° C., 25° C., 85° C.) as a parameter. A sample having a threshold voltage Vth=0.6 V, W/Leff=630 μm/1.0 μm (W is the channel width and Leff is the effective channel length) was used as the NMOS transistor N1. In FIG. 1, B1 is an npn bipolar transistor, which parasitizes the NMOS transistor 1 and is constituted by the drain, back gate and source thereof.

From the characteristic curves in FIG. 2, it is understood that the current Ids rapidly increases from a certain gate potential Vgs. In the test, the current limit was 10 μA to prevent the device from breaking by the flow of such a huge current. It is however apparent from the sharp rise of the characteristic curves that avalanche breakdown has occurred. It is apparent from the characteristic curves that with the gate-source voltage Vgs=0 v, the avalanche breakdown voltage of the parasitic bipolar transistor itself is observed, whereas when Vgs>0 v, the breakdown voltage becomes lower.

Figure 3:
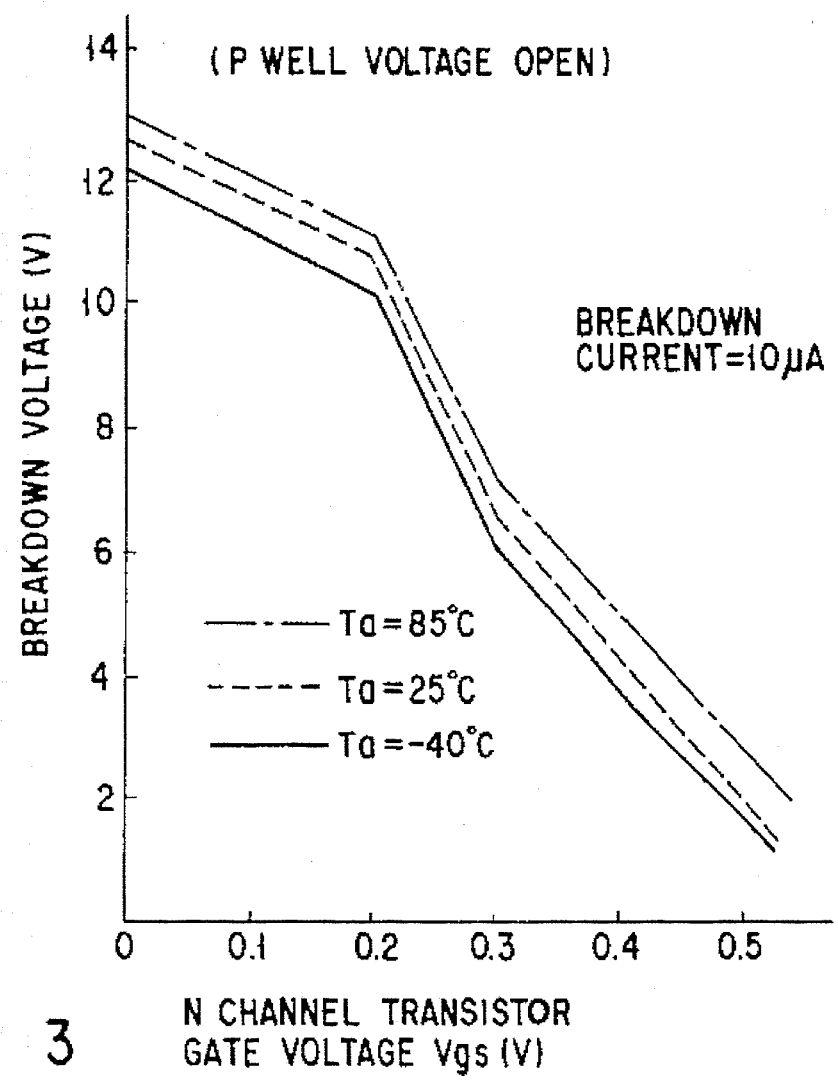
FIG. 3 is a chart showing characteristic curves obtained by the testing circuit.

FIG. 3 shows the characteristic curves of the breakdown voltage versus the gate potential obtained from the characteristic curves in FIG. 2. The possible reason why the avalanche breakdown has occurred at a low gate voltage as shown in FIGS. 2 and 3 is that the application of a positive gate voltage to the gate of the transistor N1 changes the energy band mode of the semiconductor surface directly under the gate and the charge distribution, and the sub threshold current flows directly below the gate, triggering the avalanche breakdown.

The above is the description given of an NMOS transistor. With regard to a PMOS transistor, the breakdown voltage is controllable like the NMOS transistor by setting the gate potential lower than the source potential.

Figure 4:
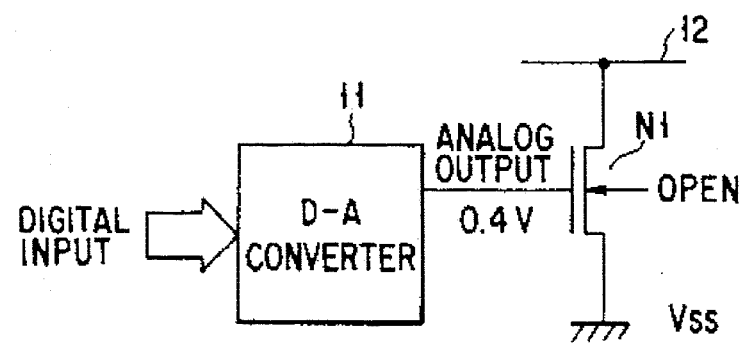
FIG. 4 is a circuit diagram of one embodiment of this invention.

FIG. 4 is a circuit diagram of one embodiment of the present invention as adapted for a signal limiter. In this example, the NMOS transistor N1 has a source connected to the ground potential ($V_{SS}$), a drain connected to a signal line 12 (e.g., the output line) and an open back gate (base of a parasitic bipolar transistor (not shown) constituted by the drain, back gate and source of the NMOS transistor N1), and a control signal applied to the gate (control gate). The output of a D/A (Digital-to-Analog) converter 11 provides the control signal to the control gate to digitally control the gate potential. For example, if 0.4V is the output of the D/A converter 11, a voltage exceeding 4.3V is applied to the drain, causing avalanche breakdown, so that the circuit has a limit potential of 4.3 v. The D/A converter 11 may be replaced with a bias generator or the like.

By changing the digital input of the D/A converter 11 to alter its analog output, the gate-source voltage Vgs changes to permit the drain-source breakdown voltage to be controllable as shown in FIG. 3. The circuit in FIG. 4 can therefore serve as a Zener diode which has a breakdown-voltage changing function. Even if the manufacturing process for the transistor N1 is fixed, therefore, the transistor N1 can have the desired avalanche breakdown voltage by controlling the gate input voltage. That is, the manufacturing process for the transistor N1 need not be altered to change the breakdown voltage.

FIG. 5 shows the case where the present invention is used in a protection circuit for the internal circuitry of a semiconductor device to protect against electrostatic discharge (ESD). In this example, the present invention is applied only to the $V_{SS}$ side. The NMOS transistor N1 has a source connected to the ground potential $V_{SS}$, an open back gate (a P well and the base of the parasitic bipolar transistor), and a gate connected to the base of an NPN transistor BP1. The collector of the NPN transistor BP1 is connected to the drain of the NMOS transistor N1. The base of the transistor BP1 is connected to the ground $V_{SS}$ via its own resistor component $R_P$ (e.g., the resistor component up to the $V_{SS}$-biasing portion of another P well). The drain of the transistor N1 is connected to an external terminal 21 of an integrated circuit which constitutes the present circuit, and further to the gate of a MOS transistor T5, an element of the internal circuit.

In FIG. 5, when a positive surge voltage (greater than the supply voltage is applied to the drain node of the transistor N1 through the external terminal 21, the current flows through the base of the transistor BP1 due to the breakdown of the PN junction diode between the collector and base of the transistor BP1. Consequently, the base potential rises above $V_{SS}$ by the resistor component $R_P$ of the base of the transistor BP1 itself, forward-biasing the base and emitter (e.g., to 0.6 v or higher). As a result, the transistor BP1 is turned on, causing the positive surge to escape toward $V_{SS}$. As the base potential rises, the gate potential of the NMOS transistor N1 also rises. As described above, therefore, breakdown occurs at a voltage much lower than the avalanche breakdown voltage when the back gate of the transistor N1 is at ground potential, causing the surge to escape toward $V_{SS}$. In other words, the force to permit the escape of the surge is enhanced by the circuit with the MOS transistor N1 in addition to the transistor BP1 as shown in FIG. 2, as compared with the circuit employing only the transistor BP1.

When a negative surge is applied to the external terminal 21, the negative surge flows through the resistor component $R_P$ and the transistor BP1. This current becomes the base current of the transistor BP1, turning transistor BP1 on. This increases the gate bias of the transistor N1, lowering the avalanche breakdown voltage. As a result, the negative surge escapes toward $V_{SS}$ by the enabled transistor BP1 and the avalanche breakdown of the transistor N1.

The breakdown of the MOS transistor T5 in the internal circuit is prevented in this manner.

FIG. 6 shows the case where the present invention is applied to the power supply $V_{CC}$ side as well as the $V_{SS}$ side. Even if $V_{SS}$ is open and only the supply voltage $V_{CC}$ is applied, a positive surge can be allowed to escape toward $V_{CC}$. More specifically, when a transistor BP2 is turned on by the input positive surge, the gate potential of an NMOS transistor N2 rises and the avalanche breakdown voltage of the parasitic bipolar transistor of the transistor, N2 drops, allowing the positive surge to escape toward $V_{CC}$ via the parasitic bipolar transistor the transistor BP2 and NMOS transistor N2.

In FIG. 5, the bipolar transistor BP1 may be realized by arranging N diffusion layers on a P substrate (well). Similarly, in FIG. 6, the bipolar transistors BP1 and BP2 may be realized by arranging N diffusion layers on P substrates (wells). For example, the structure of the NMOS transistor N1 and the bipolar transistor BP1 in FIG. 5 is shown in FIG. 9. As shown in FIG. 9, the embodiment shown in FIG. 5 requires a P well structure on an N substrate 31 since it is necessary to separate the P substrate (well) 32 in which the NMOS transistor N1 is formed and the P substrate (well) 33 in which the bipolar transistor BP1 is formed from each other. Substantially the same is true for the structure of the embodiment shown in FIG. 6, which is not shown.

The transistors BP1 and BP2 in FIGS. 5 and 6 may respectively be replaced with NMOS transistors N3 and N4 formed on a P well different from the P well of the NMOS transistors N1 and N2, as shown in FIGS. 7 and 8. The sources and drains of MOS transistors N3 and N4 correspond to the emitters and collectors of the bipolar transistors BP1 and BP2 in FIGS. 5 and 6, and the back gate (substrate) corresponds to the base. The gates of the transistors N3 and N4 are connected to $V_{SS}$ to increase the breakdown voltages of the transistors, so that the transistors are set off. In this case, the interval between the source and drain can be made narrower than that in the case where the N diffusion layers of the source and drain are simply set close to each other on the P substrate as shown in FIGS. 5 and 6, i.e., the base length can be shortened. The surge escaping performance can therefore be improved.

The present invention is not limited to the above-described embodiments, but may be embodied in various other applications. For example, although this invention is adapted for an NMOS transistor in the embodiments, this invention can also be adapted for a PMOS transistor in principle.

According to the present invention, as described above, since the avalanche breakdown voltage of a MOS transistor is controllable, it is possible to prevent the avalanche breakdown of the MOS transistor from occurring to, permit the avalanche breakdown to occur at an early stage, or to delay the occurrence of the avalanche breakdown as much as possible. This widens the fields of the application of MOS transistors, and can provide a transistor circuit which is very advantageous. According to this invention, the avalanche breakdown between the drain and source of a MOS transistor with an open back gate is controllable so that the MOS transistor is permitted to function like a Zener diode having a breakdown-voltage changing function. By the utilization of this function, a lower breakdown voltage than conventionally known can be obtained so that a transistor circuit having a high electrostatic breakdown can be provided.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A transistor circuit comprising:

a MOS transistor having a control gate, a source, a drain and an open back gate;

control means for controlling a voltage applied to said control gate of said MOS transistor, said control means controlling an avalanche breakdown voltage of a parasitic bipolar transistor formed by said drain, said back gate and said source of said MOS transistor.

2. The transistor circuit according to claim 1, wherein a channel passage of said MOS transistor has a first end connected to a power supply electrode, and a second end connected to a signal line.

3. The transistor circuit according to claim 1, wherein said voltage applied to said control gate by said control means is variable.

4. A transistor circuit comprising:

a first MOS transistor having a control gate, a source, a drain and an open back gate;

surge detecting means, connected to said control gate of said first MOS transistor, for detecting a surge voltage and applying a voltage, according to said detected surge voltage, to said control gate of first said MOS transistor, said surge detecting means controlling an avalanche breakdown voltage of a parasitic bipolar transistor formed by said drain, said back gate and said source of said first MOS transistor.

5. The transistor circuit according to claim 4, wherein said surge detecting means comprises a bipolar transistor and a resistor between a base of said bipolar transistor and a power supply electrode, one of a collector and emitter of said bipolar transistor and a first end of a channel passage of said first MOS transistor being connected to an external terminal of an integrated circuit including said first MOS transistor and said surge detecting means, and the other one of said collector and emitter of said bipolar transistor and a second end of said channel passage of said first MOS transistor being connected to said power supply electrode.

6. The transistor circuit according to claim 5, wherein said surge detecting means includes a parasitic bipolar transistor of a second MOS transistor, and said parasitic bipolar transistor is used as said bipolar transistor of said surge detecting means.

7. A transistor circuit comprising:

a first MOS transistor having a control gate, a source, a drain and an open back gate;

first surge detecting means, connected to said control gate of said first MOS transistor, for detecting a surge voltage and applying a voltage, according to said detected surge voltage, to said control gate of said first MOS transistor, said first surge detecting means including a first bipolar transistor and a first resistor between a base of said first bipolar transistor and a first power supply electrode, one of a collector and emitter of said first bipolar transistor and a first end of a channel passage of said first MOS transistor being connected to an external terminal of an integrated circuit including said first MOS transistor and said surge detecting means, and the other one of said collector and emitter of said first bipolar transistor and a second end of said channel passage of said first MOS transistor being connected to said first power supply electrode;

a second MOS transistor having a control gate, a source, a drain and an open back gate;

second surge detecting means, connected to said control gate of said second MOS transistor, for detecting said surge voltage and applying a voltage, according to said surge voltage detected by said second surge detecting means, to said control gate of said second MOS transistor, said second surge detecting means including a second bipolar transistor and a second resistor between a base of said second bipolar transistor and a second power supply electrode, one of a collector and emitter of said second bipolar transistor and a first end of a channel passage of said second MOS transistor being connected to said external terminal of said integrated circuit, and the other one of said collector and emitter of said second bipolar transistor and a second end of said channel passage of said second MOS transistor being connected to said second power supply electrode, said first and second surge detecting means respectively controlling avalanche breakdown voltages of parasitic bipolar transistors formed by said drains, said back gates and said sources of said first and second MOS transistors.

8. The transistor circuit according to claim 7, wherein said first and second surge detecting means respectively include parasitic bipolar transistors of third and fourth MOS transistors, and said parasitic bipolar transistors are respectively used as said first and second bipolar transistors.

* * * * *